United States Patent
Kinoshita et al.

(10) Patent No.: US 6,995,437 B1
(45) Date of Patent: Feb. 7, 2006

(54) SEMICONDUCTOR DEVICE WITH CORE AND PERIPHERY REGIONS

(75) Inventors: Hiroyuki Kinoshita, Sunnyvale, CA (US); Yu Sun, Saratoga, CA (US); Basab Banerjee, Austin, TX (US); Christopher M. Foster, Austin, TX (US); John R. Behnke, Austin, TX (US); Cyrus Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 19 days.

(21) Appl. No.: 10/869,774

(22) Filed: Jun. 16, 2004

Related U.S. Application Data

(62) Division of application No. 10/382,744, filed on Mar. 5, 2003, now Pat. No. 6,780,708.

(51) Int. Cl.
*H01L 31/119* (2006.01)
(52) U.S. Cl. ............... 257/391; 257/E27.091
(58) Field of Classification Search ............... 257/391, 257/E27.097
See application file for complete search history.

(56) References Cited

U.S. PATENT DOCUMENTS

| 4,707,218 | A  | 11/1987 | Giammarco et al. ........ 156/643 |
|-----------|----|---------|----------------------------------|
| 4,792,534 | A  | 12/1988 | Tsuji et al. ................. 437/229 |
| 5,296,410 | A  | 3/1994  | Yang ......................... 437/228 |
| 5,459,345 | A  | 10/1995 | Okudaira et al. ........... 257/310 |
| 5,747,359 | A  | 5/1998  | Yuan et al. ................. 437/186 |
| 5,766,998 | A  | 6/1998  | Tseng ......................... 438/291 |
| 5,795,830 | A  | 8/1998  | Cronin et al. .............. 438/696 |
| 5,858,834 | A  | 1/1999  | Hirota et al. ............... 438/253 |
| 5,863,707 | A  | 1/1999  | Lin ............................ 430/313 |
| 6,258,671 | B1 * | 7/2001 | Manning .................... 438/275 |
| 6,346,724 | B1 | 2/2002  | Lee ............................ 257/306 |
| 6,416,933 | B1 | 7/2002  | Singh et al. ................ 430/313 |
| 6,482,726 | B1 | 11/2002 | Aminpur et al. ........... 438/585 |
| 6,664,180 | B1 | 12/2003 | Hui et al. ................... 438/637 |
| 6,828,634 | B2 * | 12/2004 | Oshima .................... 257/369 |
| 6,831,335 | B2 * | 12/2004 | Huang ........................ 257/390 |
| 6,834,013 | B2 * | 12/2004 | Fan et al. ............. 365/185.29 |
| 6,887,757 | B2 * | 5/2005  | Chen et al. ................ 438/257 |
| 2001/0003034 | A1 | 6/2001 | Furukawa et al. .......... 430/313 |
| 2001/0015454 | A1 | 8/2001 | Lee et al. ................... 257/315 |
| 2002/0006585 | A1 | 1/2002 | Koh et al. .................. 430/314 |

(Continued)

FOREIGN PATENT DOCUMENTS

EP      0655773 A1    5/1995

(Continued)

*Primary Examiner*—George Fourson
*Assistant Examiner*—Thanh V. Pham
(74) *Attorney, Agent, or Firm*—Renner, Otto, Boisselle & Sklar, LLP

(57) ABSTRACT

A method for forming a semiconductor device that includes a line and space pattern with variable pitch and critical dimensions in a layer on a substrate. The substrate includes a first region (e.g., a core region) and a second region (e.g., a periphery region). A first sub-line and space pattern in the first region comprises a space of a dimension (A) less than achievable by lithographic processes alone. Further, a second sub-line and space pattern in the second region comprises at least one line including a second critical dimension (B) achievable by lithography. The method uses two critical masking steps to form a hard mask that includes in the core region a critical dimension (A) less than achievable at a resolution limit of lithography. Further, the method uses a single etch step to transfer the pattern of the hard mask to the layer.

8 Claims, 3 Drawing Sheets

U.S. PATENT DOCUMENTS

| | | | |
|---|---|---|---|
| 2002/0063277 A1 | 5/2002 | Ramsbey et al. | 257/316 |
| 2004/0082162 A1 * | 4/2004 | Kang et al. | 438/629 |
| 2005/0167759 A1 * | 8/2005 | Matsui et al. | 257/390 |

FOREIGN PATENT DOCUMENTS

| | | |
|---|---|---|
| JP | 04207076 | 7/1992 |

* cited by examiner

SEMICONDUCTOR DEVICE WITH CORE AND PERIPHERY REGIONS

CROSS REFERENCE TO RELATED APPLICATIONS

The present application is a divisional of and claims priority under 35 U.S.C. §120 to U.S. patent application Ser. No. 10/382,744, filed Mar. 5, 2003, now U.S. Pat. No. 6,780,708.

TECHNICAL FIELD

The present invention generally relates to the manufacture of semiconductor devices and, more specifically, relates to manufacturing semiconductor devices by forming core and periphery gates including two critical masking steps to form a hard mask in a core region that includes a critical dimension less than achievable at a resolution limit of lithography.

BACKGROUND ART

In the semiconductor industry, manufacturers scale down the device dimensions to increase the performance as well as reduce the cost of manufacture. The scaling down of devices has led to the development of several new processing techniques. In the manufacture of certain devices, wet etching has been replaced with dry etching (plasma etching, reactive ion etching and ion milling). Low-resistivity suicides and refractory metals are used as replacements for high-resistivity polysilicon interconnections. Multiple-resists have been developed to compensate for wafer surface variations that thwart accurate fine-line lithography.

However, improved lithography processing techniques continue to be the main factor in the ability to scale devices. Improvements have come in, for example, lithographic tools, such as 1:1 optical projection systems fitted with deep-ultraviolet source and optics. Further, new photoresist materials have been introduced. Further still, new processes have been developed, such as a multilayer resist utilizing a top resist sensitized to X-ray or electron-beam and a bottom straight optical resist layer(s).

DISCLOSURE OF INVENTION

Despite the enhancements to lithographic tools, materials and processes, there exists a strong need in the art for an invention which forms a line and space pattern including variable critical dimensions on a substrate sub-divided into regions. Further, there is a need for an invention that forms a line and space pattern in one region that includes a first feature comprising a first critical dimension different than a second critical dimension of a second feature in another region of the substrate. Further, there is a need to form one of the features to include a critical dimension less than achievable at a resolution limit of lithography. Additionally, there is a need for an invention that saves steps in a manufacturing process by reducing the number of steps used to form a mask used in the process. Additionally, there exists a need for an invention that forms gates and spaces comprising different critical dimensions in the regions of the substrate that reduces the processing steps required to form the gates and spaces.

According to one aspect of the invention, the invention is a method of forming a layer comprising a line and space pattern over a substrate including a first region and a second region, the method comprising the steps of:

depositing and patterning a hard mask layer over the layer to form a second line and space pattern therein, wherein the second line and space pattern includes at least one line and at least one space of a minimum dimension (D) dictated by a resolution limit of lithography;

depositing a conformal hard mask layer over the hard mask layer, etching the conformal hard mask layer to form sidewall spacers on sidewalls of at least one line in the hard mask layer in the first region, whereby the minimum dimension (D) of the at least one space in the hard mask layer in the first region is reduced to a lateral dimension (A) less than achievable by the resolution limit of lithography; and etching the layer to form the line and space pattern therein corresponding to a master line and space pattern in the hard mask layer in the first region and the second region, a space in the first region includes the lateral dimension (A) less than achievable by the resolution limit of lithography and a line in the second region includes a lateral dimension (B) achievable by lithography.

According to another aspect of the invention, the invention is a method of patterning a layer on a substrate including a first region and a second region, the method comprising the steps of:

providing the substrate including the layer to be patterned interposed between the substrate and a hard mask layer to be patterned;

coating the hard mask layer to be patterned with a first photosensitive layer;

patterning and etching the first photosensitive layer to form a first patterned image including lines and at least one space in the first region, the lines in the first photosensitive layer include substantially vertical walls and the at least one space includes a minimum dimension (D) dictated by a resolution limit of lithography;

transferring to the hard mask layer the first patterned image by anisotropically etching the hard mask layer in the first region to form lines and at least one space in the first region, the lines in the hard mask layer include substantially vertical walls and the at least one space includes the minimum dimension (D) dictated by the resolution limit of lithography;

depositing a conformal hard mask layer over the hard mask layer and exposed surfaces of the substrate;

coating the conformal hard mask layer with a second photosensitive layer;

patterning and etching the second photosensitive layer to form a second patterned image including at least one line and a space in the second region, the at least one line in the second photosensitive layer includes substantially vertical walls and a lateral dimension (B) determined by a device parameter;

transferring to the hard mask layer in the second region the second patterned image anisotropically etching the conformal hard mask layer and the hard mask layer to form at least one line and a space in the hard mask layer in the second region, the at least one line in the hard mask layer includes substantially vertical walls and a lateral dimension (B) dictated by the device parameter;

forming sidewall spacers on the vertical walls of the lines in the first region whereby the minimum dimension (D) of the at least one space in the first region is reduced; and etching the layer to form a line and space pattern in the first region and the second region, an at least one space in the layer in the first region includes a lateral dimension (A) less than achievable by the resolution limit of lithography and a line in the second region is the at least one line that includes the lateral dimension (B) dictated by the device parameter.

According to another aspect of the invention, the invention is a semiconductor device, comprising:
  a semiconductor substrate including a first region, a second region and an active region;
  a dielectric layer formed over the semiconductor substrate; and
  a conductive layer formed over the dielectric layer,
  wherein the conductive layer includes:
    a first pattern in the first region comprising lines and an opening, the opening includes a dimension (A) less than achievable by a resolution limit of lithography, and
    a second pattern in the second region comprising at least one line including a lateral dimension (B) achievable by lithography.

BRIEF DESCRIPTION OF DRAWINGS

These and further features of the present invention will be apparent with reference to the following description and drawings, wherein.

MODE(S) FOR CARRYING OUT THE INVENTION

Figure 1:
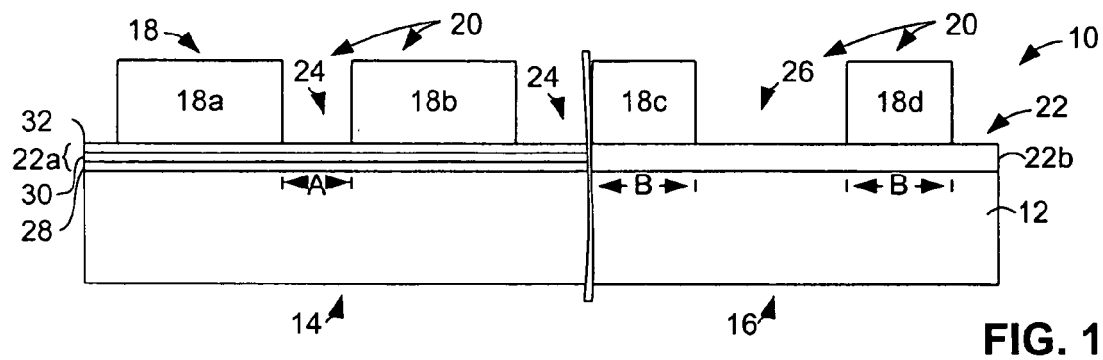
FIG. 1 is a cross-section of a patterned layer on a substrate including a pattern of opening(s) including a dimension less than achievable by a resolution limit of lithography in a first region and a line(s) including a lateral dimension achievable by lithography in a second region, according to an embodiment of the present invention.

In the detailed description that follows, identical components have been given the same reference numerals. To illustrate the present invention in a clear and concise manner, the drawings may not necessarily be to scale and certain features may be shown in a partial schematic format.

The present invention comprises a layer, including a line and space pattern, disposed over a substrate or wafer. The substrate includes at least two regions, e.g., a first region and a second region. The first region may be a core region, whereas the second region may be a periphery region. The line and space pattern over the first region or core region includes a first line and space sub-pattern comprising a first feature including a first critical dimension less than achievable at a resolution limit of lithography. For example, the first feature may be a space including, e.g., a lateral dimension as the first critical dimension. Further, the line and space pattern over the second region or periphery region includes a second line and space sub-pattern comprising a second feature including a second critical dimension that is determined by a device parameter. For example, the second feature may be a line including, e.g., a lateral dimension as the second critical dimension. The second critical dimension is achievable at a resolution limit of lithography. In other words, the layer includes a line and space pattern comprising varying pitch and critical dimensions.

The present invention includes a method of patterning a layer comprising varying pitch and critical dimensions on a substrate or wafer including at least two regions, e.g., a first region and a second region. The method uses two critical masking steps to form a hard mask. The hard mask includes a master line and space pattern comprising varying pitch and critical dimensions. Over the first region, the hard mask includes a first master line and space sub-pattern including at least one space comprising a first critical dimension less than a minimum dimension achievable at a resolution limit of lithography. Over the second region, the hard mask includes a second master line and space sub-pattern including at least one line comprising a second critical dimension. The second critical dimension is achievable by lithography processes alone. The hard mask line and space pattern is transferred to the layer using a single etch step.

In one embodiment, a semiconductor device is formed using a method further described below. The conductive layer is patterned to form gates in the first region (e.g., a core region) and the second region (e.g., a periphery region) including varying pitch and critical dimensions. In this embodiment, the method provides a means for reducing the space between the gates (e.g., core gates) in the core region by increasing the lateral dimensions of the gates in the core region. Additionally, the gates (e.g., periphery gates) and spaces formed in the periphery region include a lateral dimension achievable by lithography. The line and space pattern including variable pitch and critical dimensions, i.e., reduced space between the core gates and the lateral dimensions of the periphery gates achievable by lithography processes alone, resulting from the method significantly increase the performance of the semiconductor device while reducing the manufacturing cost thereof.

Starting with a substrate (e.g., semiconductor, insulator or metal) including a first region and a second region, a layer to be patterned is formed over the substrate. Next, a first mask layer of, for example, an insulator material, such as silicon oxide ($Si_xO_y$), is formed on the layer to be patterned. In one embodiment, the first mask layer includes a high temperature oxide (HTO). Next, an anti-reflective coating (ARC) of silicon rich nitride (SiRN), for example, is deposited on the first mask layer. Then, a first layer of photosensitive material is applied. The first layer of photosensitive material is patterned by lithographic means to form a first lithographic image. The first lithographic image includes lines and spaces in the first layer of photosensitive material in the first region. The lines and spaces include a minimum dimension dictated by a resolution limit of lithography.

Next, the first lithographic image is transferred to the first mask layer by an etch process, e.g., a plasma etch process. A first hard mask is produced including a master line and space sub-pattern in the first region. The master line and space sub-pattern includes lines and spaces including the minimum dimension dictated by the resolution limit of lithography. Then, an etch process, e.g., a directional reactive ion etching (RIE), is performed to remove the remaining first layer of photosensitive material.

Thereafter, to further reduce the size of the spaces in the first hard mask in the first region, a conformal second mask layer is applied to the exposed surfaces of the first mask layer and the layer resulting from the transfer of the first lithographic image. The thickness of the conformal second mask layer is determined by the desired reduction in the size of the spaces in the first hard mask in the first region. For example, for an elongated opening (space), the reduction in the width of the space is approximately twice the thickness of the conformal second mask layer. The conformal second mask layer may be HTO, e.g., formed by chemical vapor deposition (CVD), plasma enhanced chemical vapor deposition (PECVD) or other processes known by those having ordinary skill in the art.

Next, a second layer of photosensitive material is applied to the conformal second mask layer. The second layer of photosensitive material is now patterned by lithographic means to form a second lithographic image. The second lithographic image includes lines and spaces in the second layer of photosensitive material in the second region. The lines and spaces include a dimension dictated by a device parameter. For example, the dimension may be a minimum dimension achievable at the resolution limit of lithography. It should be understood by those with ordinary skill in the art that the pattern of lines and spaces in the second layer of photosensitive material in the second region may include a critical dimension of any dimension producible by lithography processes alone. The critical dimension is dictated by desired device parameters. Next, the second lithographic image is transferred to the first mask layer. The transfer produces lines and spaces in the first mask layer in the second region of a dimension dictated by the device parameter.

Next, an etch process, e.g., an RIE, is performed to remove the remaining second layer of photosensitive material. Another etch process, for example, another RIE using a different etchant species, is used to remove portions of the conformal second mask layer from the horizontal surfaces of the ARC and portions of the horizontal surfaces of the layer exposed by the spaces. The RIE leaves portions of the conformal second mask layer on the non-horizontal surfaces corresponding to the sidewalls of the lines in the first hard mask layer in the first region. The remaining portions are more commonly referred to as hard mask spacers.

The ARC exposed by the etch process in the first and second regions may be removed by another etch process selective to the ARC. Alternatively, an ARC strip may be performed to remove the remaining ARC material. It should be understood by those having ordinary skill in the art that removal of the ARC at this time is optional. If the ARC is not removed, then the ARC functions as part of the hard mask.

The first hard mask including the hard mask spacers in the first region and without sidewall spacers in the second region, constitutes a new mask (a second hard mask or stencil). In the first region, the new mask includes spaces with a critical dimension less than obtainable by lithography processes alone. In the second region, the new mask is unbiased by sidewall spacers. The new mask can be used to transfer the line and space pattern to the layer using a single etch step.

Thus, the new mask may be used to form gates and spaces in the first region comprising a space including a critical dimension less than achievable by the resolution limit of lithography. Further, the new mask may be used to form gates and spaces in the second region comprising a gate including a critical dimension dictated by a device parameter achievable by lithography. The new mask can be used for a variety of other purposes, including ion implantation to implant the layer or the substrate through an intervening layer(s). Alternatively, if the substrate is exposed, the substrate may be implanted directly. Further, the new mask may be used as an etch mask to etch narrow trenches in an underlying layer(s), substrate or both. Further still, the new mask may be used as an oxidation mask to form recessed oxide isolation in the exposed regions of the layer or substrate. Additionally, the new mask may be used as a contact mask to establish narrow dimensioned contacts on the layer or exposed regions of the substrate, etc.

Following such use, the new mask may be removed from the layer by subjecting the new mask to a wet or dry etchant. If the structure includes at least one gate stack structure of a typical gate, e.g., metal on semiconductor field effect transistor (MOSFET), floating gate (FG), semiconductor oxide-nitride-oxide semiconductor (SONOS) gate or the like, then conventional processes may be used to complete the semiconductor device(s). Those with ordinary skill in the art will understand wordlines, bitlines, contacts, and source and drain regions, for example, may be formed to complete a working device. For brevity sake and to focus on the inventive aspects of the present invention, the features and the processes associated with the formation of such features will not be further discussed in the present application.

Referring initially to FIG. 1, a structure of the present invention is shown, generally designated as 10. For illustrative purposes, the structure 10 will be described below in relationship to a semiconductor device 10. Although the structure 10 is also referred to herein as the semiconductor device 10, those having ordinary skill in the art will appreciate that the invention applies more generally to the formation on a substrate of a feature including a lateral dimension or critical dimension (CD) less than the CD achievable at the resolution limit of lithography in one region and a feature including a CD that is achievable at the resolution limit of lithography in another region.

The semiconductor device 10 includes a substrate 12, including a first region 14 and a second region 16. The substrate 12 also includes an active region in a surface region of the substrate (not shown), e.g., a p-type doped region. Over the substrate 12, a layer 18, including a line and space pattern 20, is formed. A dielectric layer 22 is interposed between the layer 18 and the substrate 12. In the first region 14, the line and space pattern 20 includes gate electrodes 18a and 18b and space(s) 24. In the second region 16, there are gate electrodes 18c and 18d and space(s) 26. The space(s) 24 between the gates 18a and 18b in the first region 14 includes a dimension A that is less than a minimum dimension achievable by a resolution limit of lithography. The gates 18c and 18d in the second region 16 include a lateral dimension achievable by lithography and dictated by a device parameter. In one embodiment, the lateral dimension B is a minimum dimension achievable by the resolution limit of lithography.

The semiconductor device 10 may include gates comprising conventional gate stack structures. For example, a SONOS gate structure is illustrated in the first region 14. The SONOS gate structure includes a dielectric layer 22a, e.g., an oxide-nitride-oxide (ONO) layer, interposed between gate electrodes 18a and 18b and the substrate 12. A MOSFET structure is illustrated in the second region 16. The MOSFET includes a dielectric layer 22b interposed between gate electrodes 18c and 18d and the substrate 12. Alternatively, a floating gate structure, including a dielectric layer, a charge-trapping layer, an ONO layer and a control gate may be formed (not shown).

The layer 18 may be of a conductor, a semiconductor, or an insulator material or a combination thereof as will be further described below. In one embodiment, for example, the layer 18 is polysilicon. The layer 18 may have a thickness of between about 5 nm and about 200 nm. The layer 18 is illustrated in FIG. 1 as a single layer, however, the layer 18 could be multiple layers.

The dielectric layer 22a in the first region 14 may also be referred to herein as a charge-trapping dielectric layer 22a.

The charge-trapping dielectric layer 22a may include a tunneling layer 28, a charge-trapping layer 30 and an insulating layer 32. The tunneling layer 28 is interposed between the charge-trapping layer 30 and the substrate 12. The charge-trapping layer 30 is interposed between the insulating layer 32 and the tunneling layer 28. The insulating layer 32 is interposed between the layer 18 and the charge-trapping layer 30.

The tunneling layer 28, the charge-trapping layer 30 and the insulating layer 32 may be an oxide-nitride-oxide (ONO) layer, typical of a SONOS gate structure. Alternatively, the tunneling layer 28 and/or the insulating layer 32 may be of a high-K material as will be further described below. The dielectric layer 22a may have a thickness of between about 1 nm and about 10 nm.

In one embodiment, the dielectric layer 22a may have a thickness of, for example, between about 2 nm and about 8 nm. In another embodiment, the dielectric layer 22a may have a thickness of, for example, between about 3 nm and about 7 nm. It should be understood by those having ordinary skill in the art that the above thicknesses are merely exemplary and that the thicknesses may be combined, for example, from about 1 nm to about 7 nm, or about 2 nm to about 10 nm, or about 2 nm to about 7 nm or the like.

The dielectric layer 22b in the second region 16 may also be referred to herein as a gate dielectric layer 22b. The gate dielectric layer 22b may comprise a single layer or multiple layers. Further, the gate dielectric layer 22b may be of conventional dielectric material or of a high-K material as will be further described below. The dielectric layer 22b may have a thickness of between about 1 nm and about 10 nm.

In one embodiment, the dielectric layer 22b may have a thickness of, for example, between about 2 nm and about 8 nm. In another embodiment, the dielectric layer 22b may have a thickness of, for example, between about 3 nm and about 7 nm. It should be understood by those having ordinary skill in the art that the above thicknesses are merely exemplary and that the thicknesses may be combined, for example, from about 1 nm to about 7 nm, or about 2 nm to about 10 nm, or about 2 nm to about 7 nm or the like.

The substrate 12 may be of a conductor, a semiconductor, or an insulator material or a combination thereof, as will be further described below. The substrate 12 may have a thickness of between about 50 nm and about 2,000 nm.

Figure 5:
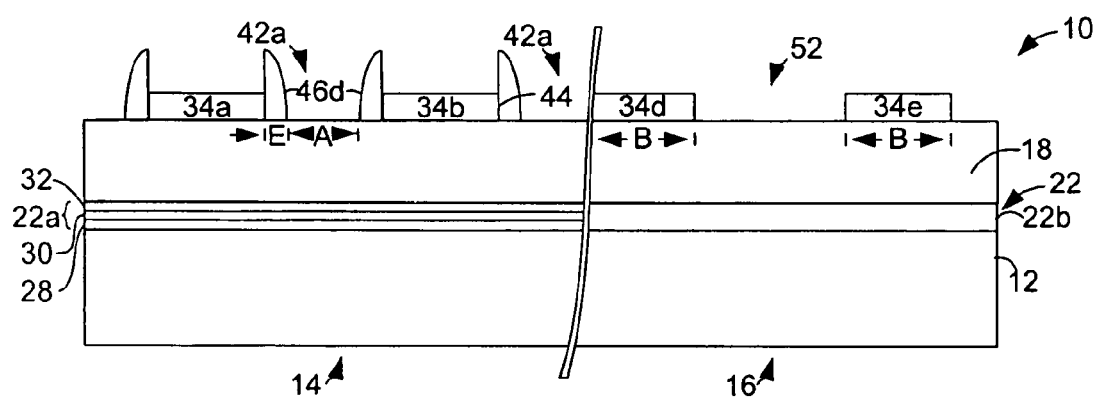
Figure 6:
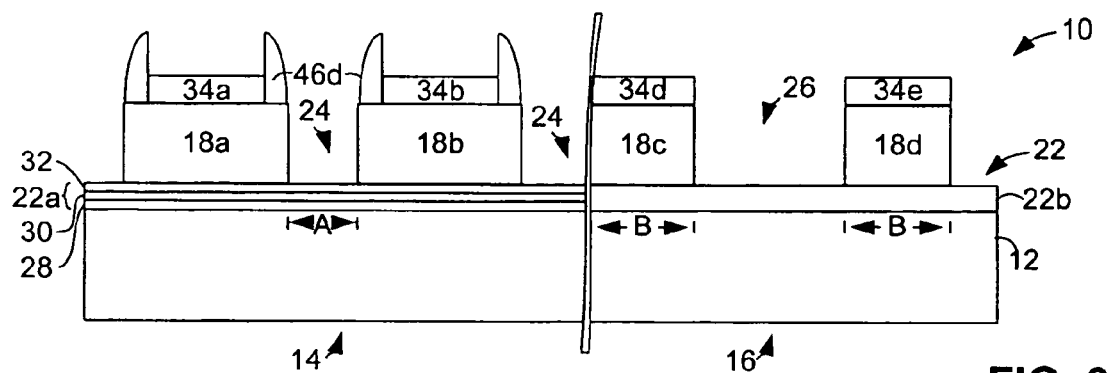

The sidewall spacers 46d (FIGS. 5 and 6) may be of a hard mask material further described below. In one embodiment, the sidewall spacers 46d are of a HTO, for example. The sidewall spacers 46d may have a thickness between about 5 nm and about 50 nm and a height between about 5 nm and about 150 nm. The sidewall spacers 46d are illustrated in FIGS. 5 and 6 as a homogeneous composition, however, the sidewall spacers 46d could comprise multiple layers or have a graded composition.

Although the illustrated device is a semiconductor device comprising a layer patterned with varying pitch and critical dimensions, other devices can also be improved using the method to pattern a layer on a substrate including variable pitch and critical dimensions as further described herein.

Figure 7:
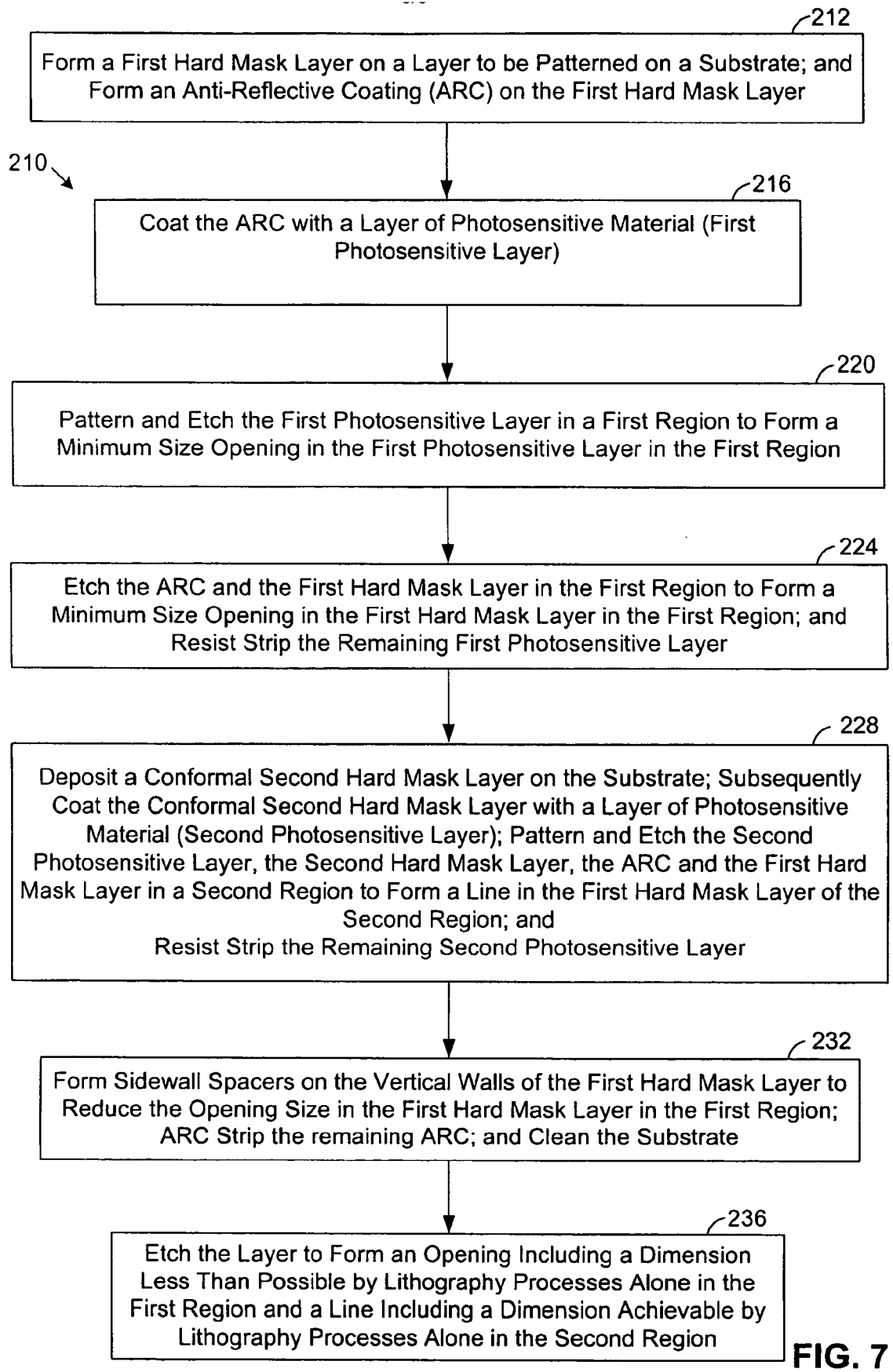
FIG. 7 is a flow diagram of a method of manufacturing the patterned layer according to the present invention.

The steps of a method 210 for fabricating a semiconductor device 10 are outlined in the flow chart shown in FIG. 7. FIGS. 2–6 illustrates various steps of the method 210. It will be appreciated that the method 210 and the semiconductor device 10 described below are merely exemplary, and that suitable embodiments of the many above-described variations in materials, thicknesses, and/or structures may alternatively be used in the method 210 and/or the semiconductor device 10.

Figure 2:
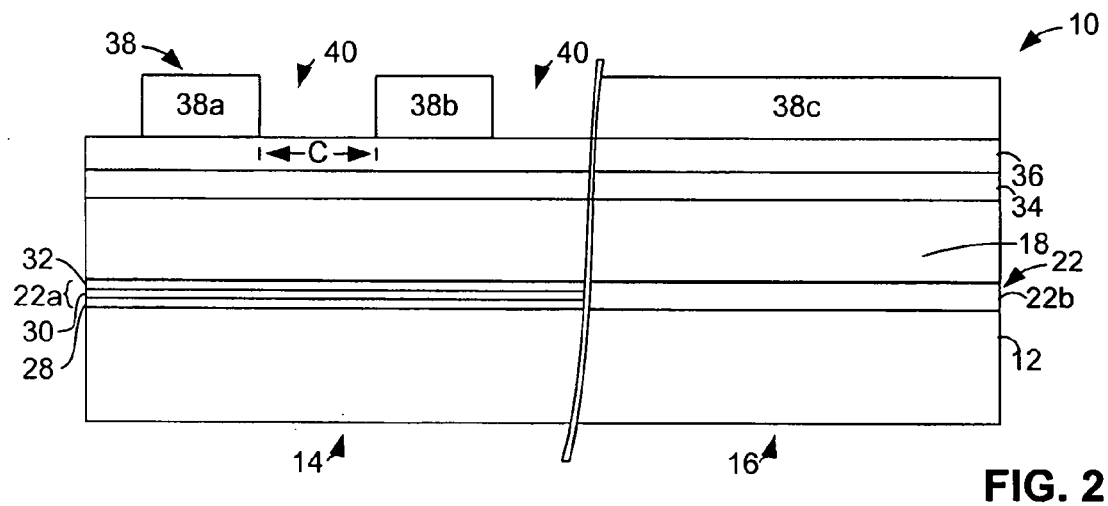
FIGS. 2–6 are sequential cross-sections of a method of manufacturing the patterned layer according to the present invention at intermediate stages of manufacture.

In Step 212, as represented in FIG. 2, a structure representing an intermediate step of the manufacturing process of the semiconductor device 10 is shown. The method is initiated with a substrate 12. The substrate 12 may be of any substrate material. For example, the substrate 12 may be a conductor, a semiconductor, a compound semiconductor or an insulator material, for example, metal, silicon, GaAs, InGaAs, silicon oxide, glass, photosensitive material or a combination thereof. Further, the substrate 12 may include at least one of silicon, germanium, silicon-germanium alloys, silicon-carbon alloys, silicon-germanium alloys containing carbon, and other conductive and semi-conductive materials; the aforementioned materials implanted with any element; the aforementioned materials in layered or graded composition combinations; the aforementioned materials in porous; amorphous, single crystal, polycrystalline, nanocrystalline form; and mixtures thereof.

Over the substrate 12, a dielectric layer 22 of one or more layers is formed, grown, deposited, spin coated or the like, or a combination thereof, on the semiconductor substrate 12 using known techniques. For example, a PVD, a PECVD or a CVD process appropriate for the layer being deposited may apply the dielectric layer 22. For illustrative purposes, the dielectric layer 22 includes a charge-trapping dielectric layer 22a formed over the first region 14 and a gate dielectric layer 22b formed over the second region 16. The charge-trapping dielectric layer 22a includes a tunneling layer 28, a charge-trapping layer 30 and an insulating layer 32. The gate dielectric layer 22b is illustrated as a single layer; however, it may be comprised of multiple layers. The tunneling layer 28 and the insulating layer 32 may be of a conventional dielectric material, e.g., $Si_xO_y$, or of a high-K dielectric material, as further described above. The charge-trapping layer 30 may be of any material that is compatible with the first and second dielectric layers and is capable of storing a charge. The charge-trapping layer 30 may be a nitride, e.g., silicon nitride, silicon oxynitride or the like. The dielectric layer 22 may have a thickness of between, for example, about 1 nm and about 250 nm. Each sub-layer will be deposited to a thickness according to a desired device parameter for a semiconductor device 10 to be realized. It should be understood by those having ordinary skill in the art that the charge-trapping dielectric layer 22a may comprise only two layers, e.g., the tunneling layer 32 and the charge-trapping layer 34.

Next, the layer 18 is formed, grown, deposited, spin coated or the like, or a combination thereof, on the dielectric layer 22 using known techniques. For example, the layer 18 may be deposited over the dielectric layer 22 by chemical vapor deposition (CVD), plasma enhanced chemical vapor deposition (PECVD), atomic layer deposition (ALD) or the like.

The layer 18 may be of any material desired to be patterned. For example, the layer 18 may be of non-conductive material, conductive material, semiconductive material, dielectric material or a combination thereof. The layer 18, for example, comprises at least one of silicon, germanium, silicon-germanium alloys, silicon-carbon alloys, silicon-germanium alloys containing carbon, GaAs, InGaAs, and other conductive and semi-conductive materials; silicon oxide ($Si_xO_y$), silicon-dioxide ($SiO_2$), aluminum oxide ($Al_2O_3$), hafnium oxide (HfO), zirconium oxide (ZrO), titanium oxide (TiO), yttrium oxide (YO), lanthanum oxide ($La_2O_3$), cerium oxide ($CeO_2$), bismuth silicon oxide ($Bi_4Si_2O_{12}$), tantalum oxide ($Ta_2O_5$), tungsten oxide ($WO_3$), $LaAlO_3$, BST ($Ba_{1-x}Sr_xTiO_3$), $PbTiO_3$, $BaTiO_3$, $SiTiO_3$, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$), binary and tertiary metal oxides, other metal oxides; silicon nitride ($Si_xN_y$), silicon oxynitride ($SiO_xN_y$), other nitrides; zirconium silicate, hafnium silicate, other silicates; ferro electric material; silicide of a metal having a high melting point such as W, Ta, Ti, Mo or the like; polycide made of the silicide (for example, $MoSi_2$, $WSi_2$) and polysilicon; and the other metals; the aforementioned materials implanted with any element; the aforementioned materials in layered or graded composition combinations; the aforementioned materials in porous, amorphous, single crystal, polycrystalline, or nanocrystalline form; and mixtures thereof. The layer 18 may be a single layer or multiple layers. Further, the layer 18 may be of a material including a permittivity greater than a permittivity of silicon-dioxide ($SiO_2$), i.e., about 3.9.

Permittivity, $\epsilon$, of a material reflects the ability of the material to be polarized by an electric field. The permittivity of a material is typically described as its permittivity normalized to the permittivity of a vacuum, $\epsilon_o$. Hence, the relative permittivity, referred to as a dielectric constant, of a material is defined as:

$$K=\epsilon/\epsilon_o.$$

While silicon-dioxide ($SiO_2$) (sometimes simply referred to as "oxide") has a dielectric constant of approximately 3.9, other materials have higher K values. For example, aluminum oxide ($Al_2O_3$) has a K of about 9 to about 10. Much higher K values of, for example, 20 or more, can be obtained with various transition metal oxides, including tantalum oxide ($Ta_2O_5$), hafnium oxide ($HfO_2$) and zirconium oxide ($ZrO_2$).

Using a dielectric material including a higher K for the gate dielectric allows a high capacitance and an electrical equivalent thickness of a thinner silicon-dioxide ($SiO_2$) gate dielectric layer to be achieved while maintaining or increasing the physical thickness of the gate dielectric. For example, an aluminum oxide ($Al_2O_3$) layer that includes a K of 9.6 and a physical thickness of 6.25 nm substantially electrically equivalent to a silicon oxide ($SiO_2$) layer (K=3.9) including a physical thickness of 2.5 nm. Therefore, the gate dielectric can be made electrically thin while being formed of a physically thicker layer compared to conventional $SiO_2$ gate dielectric layer.

Examples of dielectric material including a high K include the following: aluminum oxide ($Al_2O_3$), hafnium oxide ($HfO_2$), zirconium oxide ($ZrO_2$), zirconium oxide (ZrO), titanium oxide (TiO), yttrium oxide (YO), zirconium silicate, hafnium silicate, lanthanum oxide ($La_2O_3$), cerium oxide ($CeO_2$), bismuth silicon oxide ($Bi_4Si_2O_{12}$), tantalum oxide ($Ta_2O_5$), tungsten oxide ($WO_3$), $LaAlO_3$, BST ($Ba_{1-x}Sr_xTiO_3$), $PbTiO_3$, $BaTiO_3$, $SiTiO_3$, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$) or the like. Additionally, the insulating layer may comprise other binary and tertiary metal oxides and ferro electric material including a dielectric constant greater than silicon-dioxide ($SiO_2$).

For exemplary purposes, the layer 18 is of a polysilicon. The polysilicon may be deposited on the substrate 12 using a PECVD process. The layer 18 may have a thickness, for example, between about 5 nm to about 1,000 nm thick.

After forming the layer 18, a first hard mask layer 34 is formed, grown, deposited, spin coated or the like, or a combination thereof, on the layer 18 again using conventional techniques. For example, the first hard mask layer 34 may be thermally grown by conventional techniques. Alternatively, the first hard mask layer 34 may be deposited using conventional techniques. Further, the first hard mask layer 34 may be formed using a combination of the above, e.g., a thin oxide layer may be thermally grown to form a good interface and then an oxide of lesser quality may be deposited thereon.

The first hard mask layer 34 may be of any known mask material. For illustrative purposes, the first hard mask layer 34 is formed of a high temperature oxide material (HTO). The first hard mask layer 34 may have a thickness of between about 5 nm and about 1,000 nm, for example. The first hard mask layer material may also comprise at least one of silicon oxide, $Si_xO_y$, silicon-dioxide ($SiO_2$), other oxides; silicon nitride ($Si_xN_y$), silicon rich nitride, oxygen rich nitride, other nitrides; the aforementioned materials implanted with any element; the aforementioned materials in layered or graded composition combinations; the aforementioned materials in porous, amorphous or nanocrystalline form; and mixtures thereof.

Next, an anti-reflective coating (ARC) 36 is applied, for example, by CVD. For illustrative purposes, the ARC 36 comprises silicon rich nitride (SiRN). The ARC 36 may have a thickness in the range of about 10 nm to about 500 nm, for example. The ARC 36 material may also comprise at least one of silicon oxide, $Si_xO_y$, silicon-dioxide ($SiO_2$), silicon rich oxide (SiRO), other oxides; silicon nitride ($Si_xN_y$), SiRN, oxygen rich nitride, other nitrides; silicon carbide ($Si_xC_y$), other carbides; amorphous carbon, spin on organic ARC material; the aforementioned materials implanted with any element; the aforementioned materials in layered or graded composition combinations; the aforementioned materials in porous, amorphous or nanocrystalline form; and mixtures thereof. The ARC 36 is optional. However, the ARC 36 is used when increased resolution of the lithography process is required.

Next in Step 216, a first photosensitive layer 38 of a photosensitive material is applied over the ARC 36, for example, by spin-coating. The first photosensitive layer 38 may have a thickness in the range of about 30 nm to about 500 nm, for example. The first photosensitive layer 38 is a photoresist selective to the first hard mask layer 34 or the ARC 36, if an ARC is used. That is, the photoresist is compatible with the first hard mask layer 34 and when processed, can be used as an etch mask to etch a lithographic image into the first hard mask layer 34.

Then, in Step 220, the first photosensitive layer 38 is patterned (i.e., patterned to form sub-first photosensitive layers 38a–38c, i.e., a lithographic image) by pattern-exposing using a conventional lithographic tool, developed, rinsed and dried. Next, an anisotropic etching is conducted to form an opening(s) 40, also referred to as spaces, in the first photosensitive layer 38 according to the pattern. For simplicity of illustration, in FIG. 2, only two openings 40 and two lines (sub-first photosensitive layers 38a and 38b) are shown in the first region 14. The two lines 38a and 38b include substantially vertical surfaces.

The opening 40 between the two lines 38a and 38b include a lateral dimension C. The dimension C represents, for example, the minimum dimension that is obtainable at the resolution limit of the lithography processes utilized in Step 220. That is, the dimension C may be the smallest dimension that is achievable by pushing known lithography (including x-ray, electron-beam or the like) to its highest resolution limit. This is considered the first critical masking step.

Next, the patterned sub-first photosensitive layers 38a–38c are subjected to a hardening process step to thermally stabilize the patterned sub-first photosensitive layers 38a–38c. Deep ultraviolet exposure or heat treatment at a temperature of about 200° C. to about 250° C. for about 1–2 minutes may be used for hardening. Alternatively, the patterned sub-first photosensitive layers 38a–38c may be hardened by subjecting the patterned sub-first photosensitive layers 38a–38c to a halogen gas plasma. The hardening step is needed for conventional photoresists, lest the photosensitive material constituting the patterned sub-first photosensitive layers 38a–38c may melt and flow or otherwise get degraded during the subsequent processes. The hardening of the photoresistant material may not be required for photoresistant material including a higher melting point as will be understood by those having ordinary skill in the art.

Figure 3:
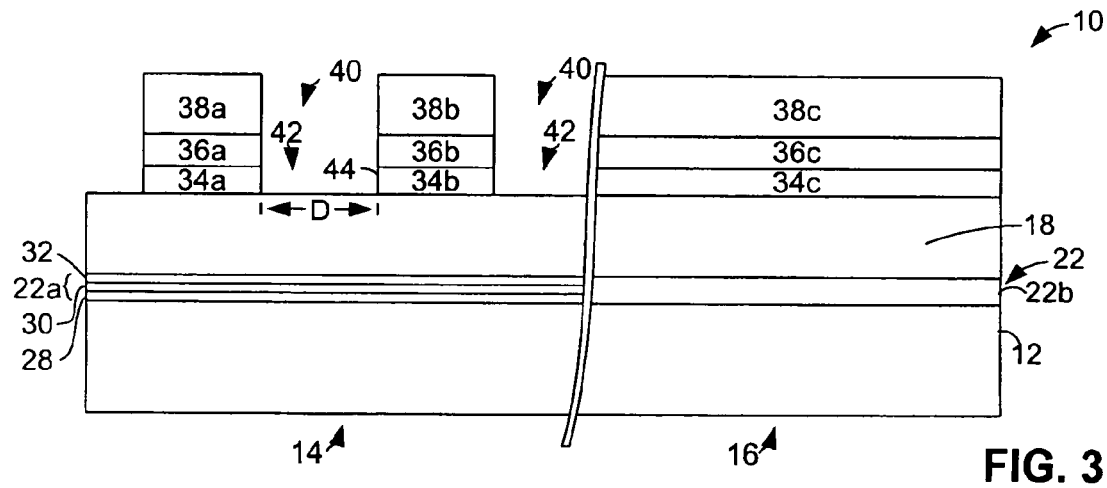

Next, in Step 224, as illustrated in FIG. 3, an anisotropic etch is conducted to transfer the lithographic image of the patterned sub-first photosensitive layers 38a–38c to the first hard mask layer 34 in the first region 14. An etchant removes the ARC 36 exposed by the openings 40 and the first hard mask layer 34 beneath the exposed ARC 36. The etch step leaves openings 42 including a lateral dimension D in the patterned first hard mask layer 34. In one embodiment, the line/space ratio in the first region 14 may be, for example, from about 0.07 $\mu$m/0.09 $\mu$m. In another embodiment, the line/space ratio in the first region 14 may be, for example, from about 0.10 $\mu$m/0.15 $\mu$m. In another embodiment, the line/space ratio in the first region 14 may be, for example, from about 0.12 $\mu$m/0.19 $\mu$m. In other words, for a specific pitch, e.g., 160 nm, 250 nm or 310 nm, a line is about 40% of the pitch.

The resultant structures include a first vertical stack (34a, 36a, 38a) and a second vertical stack (34b, 36b, 38b) in the first region 14 and a third vertical stack (34c, 36c, 38c) covering in the second region 16. The first vertical stack (34a, 36a, 38a) includes a sub-first hard mask layer 34a, a sub-ARC layer 36a and a sub-first photosensitive layer 38a. The second vertical stack (34b, 36b, 38b) includes a sub-first hard mask layer 34b, a sub-ARC layer 36b and a sub-photosensitive layer 38b. The third vertical stack (34c, 36c, 38c) includes a sub-first hard mask layer 34c, a sub-ARC layer 36c and a sub-first photosensitive layer 38c.

Openings 42 formed in the first hard mask layer 34 as a result of the transfer include substantially vertical surfaces 44. The dimension D is approximately equal to dimension C (shown in FIG. 2). A subsequent anisotropic etching removes the remaining photosensitive material of the first photosensitive layer 38, i.e., the sub-first photosensitive layers 38a–38c. Thus, the lithographic image is transferred from the patterned first photosensitive layer 38 to the first hard mask layer 34 in the first region 14.

Figure 4:
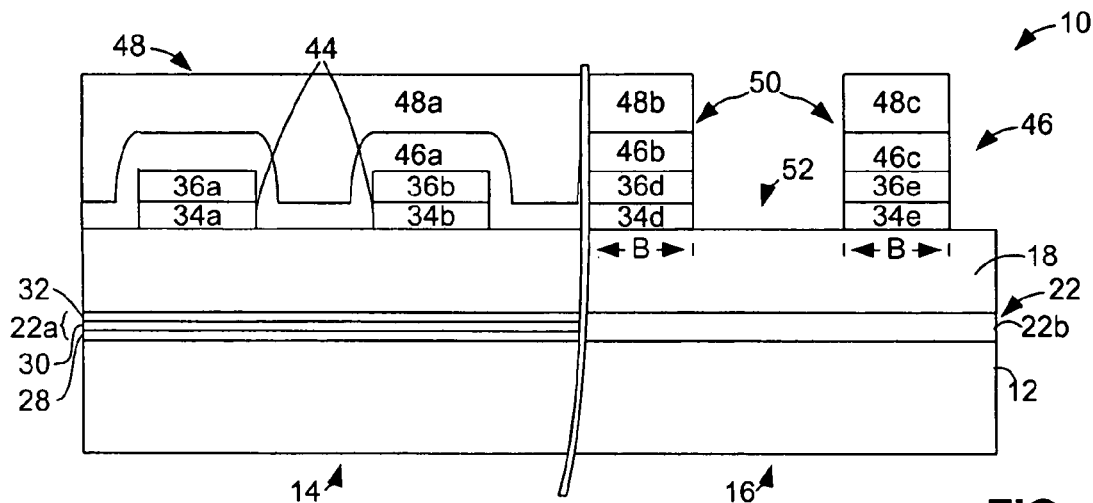

In the next two Steps 228 and 232, as illustrated in FIGS. 4–5, sidewalls are formed on the vertical surfaces 44 of the sub-first hard mask layers 34a and 34b and the sub-ARC layers 36a and 36b in the first region 14 to reduce by a lateral dimension E (FIG. 5) the openings 42 (FIG. 3). Further, the third vertical stack (34c, 36c, 38c) in the second region 16 is patterned and etched to form lines 50 in the sub-first hard mask layer 34c in the second region 16. The lines 50 include a width dimension achievable using lithography.

Referring now to FIG. 4, a conformal second hard mask layer, generally designated 46, is formed over the substrate 12. Specifically, the conformal second hard mask layer 46 is formed over the patterned sub-first hard mask layers 34a–34c, the sub-ARC layers 36a–36c and the portion of the layer 18 exposed by the openings 42 (see FIG. 3). The conformal second hard mask layer 46 may be any material that can be deposited on the patterned sub-first hard mask layers 34a–34c, the sub-ARC layers 36a–36c and the layer 18 exposed in the openings 42. Examples of conformal second hard mask layer material include the materials described above associated with the first hard mask layer 34. In a particular embodiment, the conformal second hard mask layer 46 may be of the same material as the first hard mask layer 34. In one embodiment, the conformal second hard mask layer 46 is $Si_xO_y$ obtained by hexamethyldisilazane (HMDS) plasma deposition.

Typically, the conformal second hard mask layer 46 is formed by mounting the substrate 12 in a plasma deposition system. Then, liquid HMDS is introduced into the process chamber and the necessary electric field is generated therein which transforms the liquid HMDS into a HMDS plasma. The HMDS plasma will be deposited on the structure until a uniform conformal second hard mask layer 46 of plasma-deposited HMDS, including the composition $Si_xO_y$, is obtained.

The thickness of conformal second hard mask layer 46 is determined by the desired reduction in the lithographic image size in the first hard mask layer 34. Typically, for very large scale integrated circuit fabrication, the thickness of the conformal second hard mask layer 46 is in a range of about 3 nm to about 900 nm. Alternatively, the thickness may be in a range of about 10 nm to about 100 nm. Further still, the thickness may be in a range of about 30 nm to about 50 nm. It should be understood by those having ordinary skill in the art that the above thicknesses are merely exemplary and that the thicknesses may be combined, for example, from about 3 nm to about 50 nm, or about 10 nm to about 30 nm, or about 30 nm to about 100 nm or the like. The lower limit for the thickness of the conformal second hard mask layer 46 is dictated by the requirements of good step coverage associated with the substantially vertical wall profile in the first hard mask layer 34, the ARC 36 and the viability of the conformal second hard mask layer 46 as a thin layer. The upper limit for the thickness of the conformal second hard mask layer 46 is determined by the desired percentage reduction in the size of the opening 42 in the first hard mask layer 34.

The percentage reduction in the opening dimension is governed by the factor 2E/D. In other words, if the dimension of the opening is 15 nm, in order to achieve a 66.6% reduction in the dimension of the openings 42 (or an actual reduction of the opening dimension to about 5 nm), a 5 nm thick conformal second hard mask layer 46 is deposited.

Next, a second photosensitive layer, generally designated 48, of a photosensitive material is applied, for example, by spin-coating. The second photosensitive layer 48 may be of the same or different material as the first photosensitive layer 38. The second photosensitive layer 48 may have a thickness in the range of about 30 nm to about 500 nm, for example.

Next, the second photosensitive layer 48 is patterned (i.e., patterned sub-second photosensitive layers 48a–48c) by pattern-exposing using a conventional lithographic tool, developed, rinsed and dried as described above. Next, an anisotropic etching is conducted to form an opening 52 in the second region 16 in the second photosensitive layer 48, the conformal second hard mask layer 46, the sub-ARC layer 36c, and the sub-first hard mask layer 34c (see FIG. 3) according to the pattern.

The resultant structures include a fourth vertical stack (34a, 34b, 36a, 36b, 46a, 48a) in the first region 14 and a fifth vertical stack (34d, 36d, 46b, 48b) and a sixth vertical stack (34e, 36e, 46c, 48c) in the second region 16. The fourth vertical stack (34a, 34b, 36a, 36b, 46a, 48a) includes the sub-first hard mask layers 34a and 34b, the sub-ARC layers 36a and 36b, a sub-conformal second hard mask layer 46a and a sub-second photosensitive layer 48a. The fifth vertical stack (34d, 36d, 46b, 48b) includes a sub-first hard mask layer 34d, a sub-ARC layer 36d, a sub-conformal second hard mask layer 46b and a sub-second photosensitive layer 48b. The sixth vertical stack (34e, 36e, 46c, 48c) includes a sub-first hard mask layer 34e, a sub-ARC layer 36e, a sub-conformal second hard mask layer 46c and a sub-second photosensitive layer 48c.

Lines 50 comprising the fifth vertical stack (34d, 36d, 46b, 48b) and sixth vertical stack (34e, 36e, 46c, 48c) include a lateral dimension B. The lines 50 have substantially vertical surfaces. The dimension B represents, for example, the smallest dimension obtainable by lithography utilized in patterning the second photosensitive layer 48. However, it should be understood that the dimension B is a dimension dictated by device requirements. This is considered the second critical masking step. If the second photosensitive layer 48 requires a hardening process, then the second photosensitive layer 48 may be hardened using the process described above.

In one embodiment, the line/space ratio in the second region 16 may be, for example, 0.07 $\mu$m/0.09 $\mu$m. In another embodiment, the line/space ratio in the second region 16 may be, for example, 0.10 $\mu$m/0.15 $\mu$m. In another embodiment, the line/space ratio in the second region 16 may be, for example, 0.12 $\mu$m/0.19 $\mu$m. In another embodiment, the line/space ratio in the second region 16 may be, for example, 0.15 $\mu$m/0.16 $\mu$m. It should be understood by those having ordinary skill in the art that the above line/space ratios are merely exemplary and that the ratios may be tailored to the specific pitch, for example, 0.08 $\mu$m/0.08 $\mu$m, 0.12 $\mu$m/0.13 $\mu$m, 0.13 $\mu$m/0.18 $\mu$m or the like.

Next, in Step 232, the conformal second hard mask layer 46 is anisotropically etched to remove it from all the substantially horizontal surfaces of the sub-ARC layers 36a–36b and portions of the layer 18 leaving it only on the substantially vertical surfaces of the sub-first hard mask layers 34a–34b and the sub-ARC layers 36a–36b in the first region 14. Next, an ARC strip is done to remove the remaining ARC 36 (sub-ARC 36a–36b and 36d–36e) in both the first region 14 and the second region 16.

The resulting structure will be as shown in FIG. 5 where the unetched portions of the conformal second hard mask layer 46 now serve as sidewall spacers 46d on the vertical surfaces 44 of the sub-first hard mask layers 34a–34b in the first region 14. In the second region 16, the sub-first hard mask layers 34d–34e will not be biased by sidewall spacers. Due to the establishment of the sidewall spacers 46d on the vertical surfaces 44, new openings 42a are formed to include the dimension A. The relationship between the parameters A, D (shown in FIG. 3) and E is given by: A=D−2E.

Next in Step 236, portions of the layer 18 exposed by the reduced-sized openings 42a in the first region 14 and the opening in the second region 16 are removed by an RIE. The resultant structure is shown in FIG. 6. The RIE etchant used may be, for example, an etchant species selective to facilitate the removal of the exposed layer 18 while leaving the hard mask. Alternatively, the etchant used may be $O_2$ plasma.

The hard mask, comprising the first hard mask layer 34 including the sidewall spacers 46d in the first region 14, fabricated in this manner constitutes a new mask (or stencil) for forming spaces including a dimension less than obtainable by lithography alone in the first region 14. Further, the new mask includes lines 50 in the second region 16 of a dimension achievable by lithography.

In one embodiment, the line/space ratio in the first region 14 may be, for example, 0.11 $\mu$m/0.05 $\mu$m. In another embodiment, the line/space ratio in the first region 14 may be, for example, 0.15 $\mu$m/0.10 $\mu$m. In another embodiment, the line/space ratio in the first region 14 may be, for example, 0.17 $\mu$m/0.14 $\mu$m. The line/space ratio in the second region 16 will be the line/space ratio formed in Step 228.

The new mask may serve a variety of purposes. For example, it may be used as an ion implantation mask to implant an extremely narrow/small region of the substrate 12. Another application of the new mask is as an etch mask to etch extremely narrow deep/shallow trenches in the substrate 12. Yet another application is to grow a recessed isolation oxide free of bird's beak and bird's head of a width essentially equal to the dimension of the opening by subjecting the substrate 12 and the overlying stencil structure to a low temperature oxidation. A further use of the new mask is as a contact mask for establishing highly localized electrical contacts to the substrate 12.

After the new mask is used for its intended purpose, the new mask may be removed from the layer 18 by subjecting the new mask to a wet or dry etchant. The processes used, as described above, to remove the ARC 36, the exposed portions of the hard mask layer 34 and the exposed portions of the layer 18 must have good selectivity between the materials. That is, an etchant process uses an etchant species including an etch selectivity between the materials to be etched, e.g., the hard mask layer 34, the ARC 36 and the layer 18, and the spacer material of the spacers 46d. For example, after the spacers 46d are formed, a first etchant species may be used to remove the exposed portion of the ARC 36. Next, a second etchant species is used to remove the exposed portion of the layer 18. Then, a third etchant species is used to remove the exposed portion of the hard mask layer 34. Next, a fourth etchant species is used to remove the sidewall spacers 46d. It should be understood by those having ordinary skill in the art that the etchant process may actually be multiple etchant processes tailored to remove the individual material of concern. Further, one or more of the etchant species, i.e., the first etchant species, the second etchant species, the third etchant species or the fourth etchant species, may be the same etchant species.

Next, the semiconductor device 10 may be completed using conventional techniques known by those having ordinary skill in the art (not shown). For example, a spacer(s) may be formed on a sidewall(s) of the gate electrodes 18a–18d. The spacer(s) may be of an insulating film in consideration of the diffusion of the impurities in the lateral direction when forming source and drain regions. Additionally, the semiconductor device 10, may be isolated from other devices on the substrate 12 by a LOCal Oxidation of Silicon (LOCOS) oxide film or a trench device isolation film (shallow trench isolation, i.e., STI) or the like.

INDUSTRIAL APPLICABILITY

The exemplary semiconductor device 10 formed by the process described above includes a first region 14 wherein gates are formed in a core region including a space comprising a dimension less than achievable by a resolution limit of lithography processes alone and by increasing a lateral dimension of the gates in the core region. Further, gates formed in the second region 16 include a lateral dimension achievable by lithography processes alone. The semiconductor device 10 is achieved by independently masking the core and periphery gates. The independent masking allows for optimization of lithography processes, i.e., illumination conditions and etching processes, required to define the polysilicon to include varying pitch and critical dimensions. The use of sidewall spacers in the core region allows the core polysilicon to be defined to include sub-lithographic spacing. Further, the independent masking of the core and periphery regions allows for the use of different illumination conditions for both. Additionally, the use of a single hard mask to pattern a layer with varying pitch and critical dimensions reduces manufacturing costs.

An example of a device, which may take advantage of the reduction of the spacing narrower than the conventional lithography limit in a first region, is an integrated circuit wherein there is a FLASH memory cell in a first region and control devices in a second region. The formation of such a memory cell would be capable of operating at significantly higher speeds than traditional memory cell devices formed by conventional processes. Additionally, the scaling of the memory cells and control cells would allow a higher yield per wafer.

It will further be appreciated that the semiconductor device 10 may alternatively have other shapes than the shapes shown in FIG. 1. Thus, there has been disclosed a method of producing a hard mask that fully satisfies the advantages set forth above. This method permits the reduction in a minimum dimension in a portion of a lithographic image beyond what is possible by improved lithographic resolution brought about by new lithographic tool enhancements. Additionally, the method allows for the simultaneous etching of core and periphery gates with varying pitch and critical dimensions.

Although particular embodiments of the invention have been described in detail, it is understood that the invention is not limited correspondingly in scope, but includes all changes, modifications and equivalents coming within the spirit and terms of the claims appended hereto.

What is claimed is:

1. A semiconductor device, comprising:
    a substrate having a core region and a periphery region;
    a core dielectric layer formed over core region of the substrate and a periphery region dielectric layer formed over the periphery region of the substrate;
    a conductive layer formed over the core region dielectric layer and the periphery region dielectric layer; and
    a hard mask assembly formed over the conductive layer for patterning the conductive layer to have a first pattern in the core region that has conductive layer structures separated by a space and a second pattern in the periphery region that has at least one conductive layer structure, wherein the hard mask assembly includes:
        a first hard mask layer patterned to define an opening corresponding to the space between conductive layer structures in the core region and the first hard mask layer disposed over the periphery region; and
        a second hard mask layer conforming to the pattern of the first hard mask layer in the core region to laterally reduce the size of the opening corresponding to the space and patterned in the periphery region with the first hard mask layer to form a stack having a first hard mask structure and a second hard mask structure to mask the conductive layer structure of the periphery region.

2. The semiconductor device according to claim 1, wherein the core region dielectric layer is a charge-trapping dielectric assembly.

3. The semiconductor device according to claim 1, wherein the periphery region dielectric layer comprises a multiple layer gate dielectric layer.

4. The semiconductor device according to claim 2, wherein the charge-trapping dielectric assembly includes:
    a tunneling layer;
    a charge-trapping layer; and
    an insulating layer,
    wherein the tunneling layer is disposed over the substrate, the charge-trapping layer is disposed over the tunneling layer and the insulating layer is disposed over the charge-trapping layer.

5. The semiconductor device according to claim 1, wherein at least one of the core region dielectric layer and the periphery region dielectric layer includes a dielectric material having a permittivity greater than a permittivity of silicon oxide.

6. The semiconductor device according to claim 1, wherein:
    the space between conductive layer structures of the core region has a lateral dimension less than achievable by a resolution limit of lithography; and
    the conductive layer structure of the periphery region has a lateral dimension achievable by lithography.

7. The semiconductor device according to claim 1, further comprising an ARC between the first and second hard mask structures in the periphery region.

8. A semiconductor memory assembly having a core and a periphery formed by the device of claim 1 and comprising memory cells in the core having gates formed from the conductive layer structures of the core region and logic devices having gates formed from the at least one conductive layer structure of the periphery region.

* * * * *

UNITED STATES PATENT AND TRADEMARK OFFICE
CERTIFICATE OF CORRECTION

PATENT NO. : 6,995,437 B1
DATED : February 7, 2006
INVENTOR(S) : Kinoshita et al.

It is certified that error appears in the above-identified patent and that said Letters Patent is hereby corrected as shown below:

<u>Column 1,</u>
Lines 29-30, replace "Low-resistivity suicides and" with -- Low-resistivity silicides and --.

Signed and Sealed this

Eleventh Day of April, 2006

JON W. DUDAS
*Director of the United States Patent and Trademark Office*